United States Patent
Nakatsu et al.

(10) Patent No.: US 6,617,606 B2
(45) Date of Patent: Sep. 9, 2003

(54) LIGHT-EMITTING SEMICONDUCTOR ELEMENT

(75) Inventors: Hiroshi Nakatsu, Tenri (JP); Takahisa Kurahashi, Kashiba (JP); Tetsurou Murakami, Tenri (JP); Shouichi Ohyama, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/948,701

(22) Filed: Sep. 10, 2001

(65) Prior Publication Data

US 2002/0038866 A1 Apr. 4, 2002

(30) Foreign Application Priority Data

Oct. 2, 2000 (JP) ........................................ 2000-302792

(51) Int. Cl.[7] .............................................. H01L 33/00
(52) U.S. Cl. ........................... 257/14; 257/13; 257/101; 257/102; 257/103; 257/196
(58) Field of Search ............................... 257/13, 1, 17, 257/96, 97, 86, 87, 94, 101–103, 196, 615

(56) References Cited

U.S. PATENT DOCUMENTS

| | | | | |
|---|---|---|---|---|
| 5,204,284 A | * | 4/1993 | Kuo et al. | 437/127 |
| 5,309,466 A | * | 5/1994 | Ueno et al. | 372/45 |
| 5,757,835 A | * | 5/1998 | Ono et al. | 372/46 |
| 6,191,431 B1 | * | 2/2001 | Hoof et al. | 257/17 |

FOREIGN PATENT DOCUMENTS

| | | | | |
|---|---|---|---|---|
| JP | 6-112528 | | 4/1994 | |
| JP | 2000-228536 | * | 8/2000 | H01L/33/00 |

* cited by examiner

*Primary Examiner*—Bradley W. Baumeister
(74) *Attorney, Agent, or Firm*—Nixon & Vanderhye P.C.

(57) ABSTRACT

A light-emitting diode having an excellent high-speed response characteristic and capable of giving a large light output with a small variation of the light output during the operation is provided. In the light-emitting diode, an active layer comprising a single quantum well layer of p-type $Ga_{0.51}In_{0.49}P$, a lower barrier layer of p-type $(Al_{0.5}Ga_{0.5})_{0.51}In_{0.49}P$ and an upper barrier layer of p-type $(Al_{0.5}Ga_{0.5})_{0.51}In_{0.49}P$ is highly doped with p-type dopant (Zn, Mg, Be, C) or n-type dopant (Si, Se, Te) to produce non-radiative recombination level in the upper and lower barrier layers. Carriers injected into the quantum well layer not only recombine radiatively therein and also recombine nonradiatively at boundaries of the upper barrier layer and the lower barrier layer, remarkably increasing recombination velocity of carriers and dramatically improving the response characteristic.

20 Claims, 7 Drawing Sheets

CURRENT PREVENTING LAYER PORTION

LIGHT-EMITTING SEMICONDUCTOR ELEMENT

BACKGROUND OF THE INVENTION

The present invention relates to light-emitting semiconductor elements and, more specifically, to light-emitting semiconductor elements such as light-emitting diodes effectively usable for plastic fiber optic communications according to IEEE1394 and USB-2 standards.

Among group III–V compound semiconductor materials except for nitrides, industry attention has been focused on AlGaInP compound materials as of light-emitting semiconductor elements which possess the largest direct-transition band gap and a large emission output with wavelengths of 0.5 to 0.6 $\mu$m. Especially, p-n junction type light-emitting diodes (LED) each having a light-emitting portion (laminated structure including an active layer) formed by lattice matching crystal growth on a substrate GaAs are capable of emitting light having wavelengths corresponding to that of red and green at a higher response speed and greater output in comparison with conventional LEDs made of GaP and AlGaAs materials. Hence, they can be effectively used as light sources for plastic fiber optic transmission and communications systems.

Figure 1:
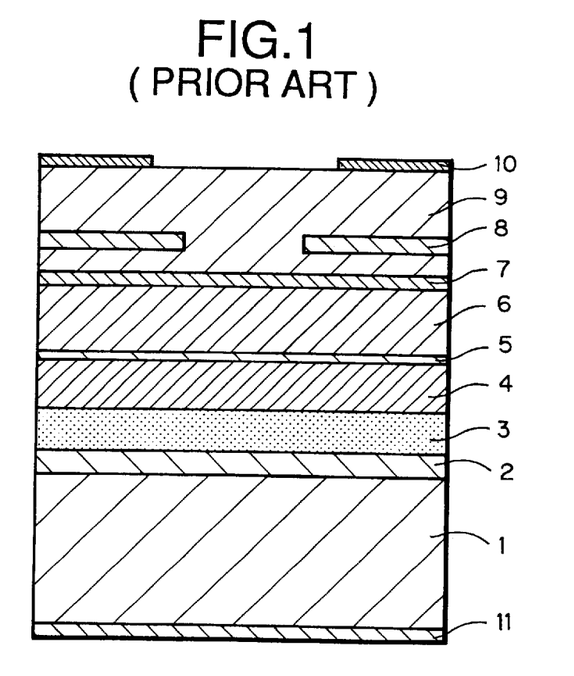
FIG. 1 is a sectional construction view of a first conventional light-emitting diode.

FIG. 1 is a sectional view of a first conventional light-emitting diode having a light-emitting portion of AlGaInP material.

The structure of the first conventional LED of AlGaInP is described bellow.

As shown in FIG. 1, the first conventional LED comprises an n-type GaAs substrate with subsequently formed thereon layers, i.e., an n-type GaAs buffer layer 2, an light-reflecting layer 3 (a DBR layer of carrier concentration of $5\times10^{17}$ cm$^{-3}$) composed of an n-type $(Al_xGa_{1-x})$As (x=0.45) and an n-type AlAs, a lower clad layer 4 of n-type $(Al_xGa_{1-x})_{0.51}In_{0.49}P$ ($0\leq x\leq 1$) (e.g., x=1.0, width 1.0 $\mu$m and carrier concentration $5\times10^{17}$ cm$^{-3}$), an active layer 5 of p-type $(Al_xGa_{1-x})_{0.51}In_{0.49}P$ ($0\leq x\leq 1$) (e.g., x=0.0, width 0.1 $\mu$m and carrier concentration $5\times10^{17}$ cm$^{-3}$), an upper clad layer 6 of p-type $(Al_xGa_{1-x})_{0.51}In_{0.49}P$)($0\leq x\leq 1$) (e.g., x=1.0, width 1.0 $\mu$m and carrier concentration $5\times10^{17}$ cm$^{-3}$), an intermediate layer 7 of p-type $(Al_xGa_{1-x})_yIn_{1-y}P$ (x=0.2, y=0.4, thickness 0.15 $\mu$m and carrier concentration $1\times10^8$ cm$^{-3}$), a current spreading layer 9 of p-type $(Al_xGa_{1-x})_yIn_{1-y}P$ (x=0.05, y=0.95, thickness 1.5 $\mu$m and carrier concentration $5\times10^{18}$ cm$^{-3}$), and a current blocking layer 8 of n-type GaP (thickness 0.3 $\mu$m and carrier concentration $1\times10^{18}$ cm$^{-3}$).

Then, the n-type GaP current blocking layer 8 is selectively etched by photolithography to form a current path of 50 to 150 $\mu$m$\phi$ in diameter therein, and the current spreading layer 9 of p-type $(Al_xGa_{1-x})_yIn_{1-y}P$ (x=0.05, y=0.05, thickness 7 $\mu$m and carrier concentration $5\times10^{18}$ cm$^{-3}$) is grown again to complete the element structure.

On the p-type current spreading layer 9, a film of, e.g., Au—Be is deposited and then circularly patterned to form a p-type electrode 10 and a light-emission area.

On the other hand, an n-type electrode 11 of, e.g., Au—Ge film is formed by deposition on the bottom surface of the GaAs substrate 1.

Thus, the first conventional light-emitting diode is completed.

The mixed crystal ratio "1-y" of indium (In) in the lower clad layer 4 of n-type $Al_yIn_{1-y}P$, the active layer 5 of p-type $Ga_yIn_{1-y}P$ and the upper clad layer 6 of p-type $Al_yIn_{1-y}P$ is set to 0.5 so as to match the crystal lattice of the GaAs substrate 1.

The p-type AlGaInP current spreading layer 9 in a $(Al_xGa_{1-x})_yIn_{1-y}P$ semiconductor is transparent to a light-emission range of wavelengths of 550 nm to 650 nm and a low resistance. To easily make an ohmic contact with the p-side electrode, the mixed crystal ratio of Al and the mixed crystal ratio of In are set to lower values, usually x=0.05 and y=0.95 respectively.

Generally, in LEDs of AlGaInP, Si is used as an n-type dopant and Zn is used as a p-type dopant.

The $(Al_xGa_{1-x})_yIn_{1-y}$ active layer 5 is usually of the p-type. Since the element is forced to emit light of 650 nm to 670 nm that is hardly absorbed in a plastic optical fiber, the mixed crystal ratio of Al in the active layer is selected within the range of 0.03 to 0.00. Since the thinner active layer may confine injected carriers to a smaller area thereof to increase the density of current therein and the higher density of carriers may shorten the lifetime of carrier recombination, the thickness of the active layer is set to 0.1 $\mu$m or less and the density of carriers therein is set to $7\times10^{17}$ cm$^{-3}$ or more. However, LEDs of AlGaInP involve such a problem that decreasing of the thickness of the active layer and/or increasing of doping concentration is accompanied in practice by decreasing of initial radiant output light power and intensive variation (increase or decrease) of output light power during the operation.

Recently, there has been proposed a LED having a quantum well structure of an active layer 5 for increasing radiant output light power and having an increased current density for improving the response characteristic.

Figure 2:
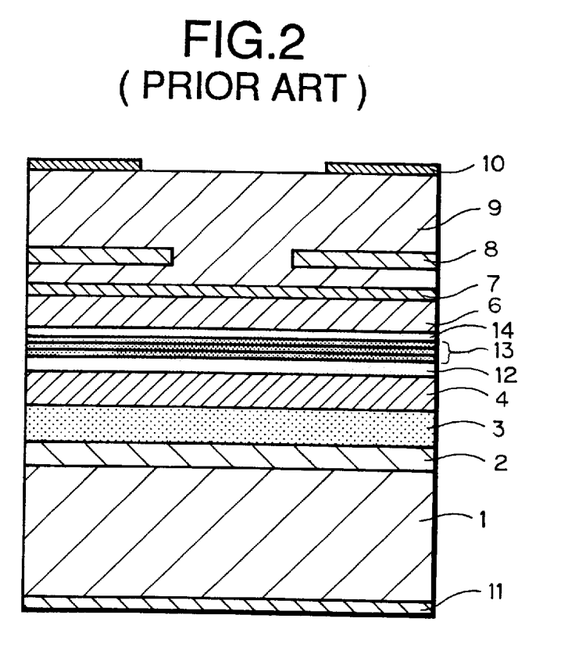
FIG. 2 is a sectional construction view of a second conventional light-emitting diode.

FIG. 2 is a sectional view of a second conventional light-emitting diode.

Referring to FIG. 2, the quantum well structure of the second conventional light-emitting diode is described below.

The LED shown in FIG. 2 differs from the first LED of FIG. 1 by merely its active layer portion that, in replace of p-type $(Al_xGa_{1-x})_{0.51}In_{0.49}P$ ($0\leq x\leq 1$) active layer 5, comprises an undoped $(Al_xGa_{1-x})_{0.51}In_{0.49}P$ ($0\leq x\leq 1$) lower barrier layer 12 (e.g., x=0.3, width 500 Å and carrier concentration $1\times10^{16}$ cm$^{-3}$), an undoped $(Al_xGa_{1-x})_{0.51}In_{0.49}P$ ($0\leq x\leq 1$) upper barrier layer 14 (e.g., x=0.3, width 500 Å and carrier concentration $1\times10^{16}$ cm$^{-3}$) and 4–10 undoped $(Al_xGa_{1-x})_{0.51}In_{0.49}P$ ($0\leq x\leq 1$) quantum-well layers 13 (e.g., x=0.0, width 80 Å and carrier concentration $1\times10^{16}$ cm$^{-3}$) sandwiched between the two barrier layers.

Figure 3:
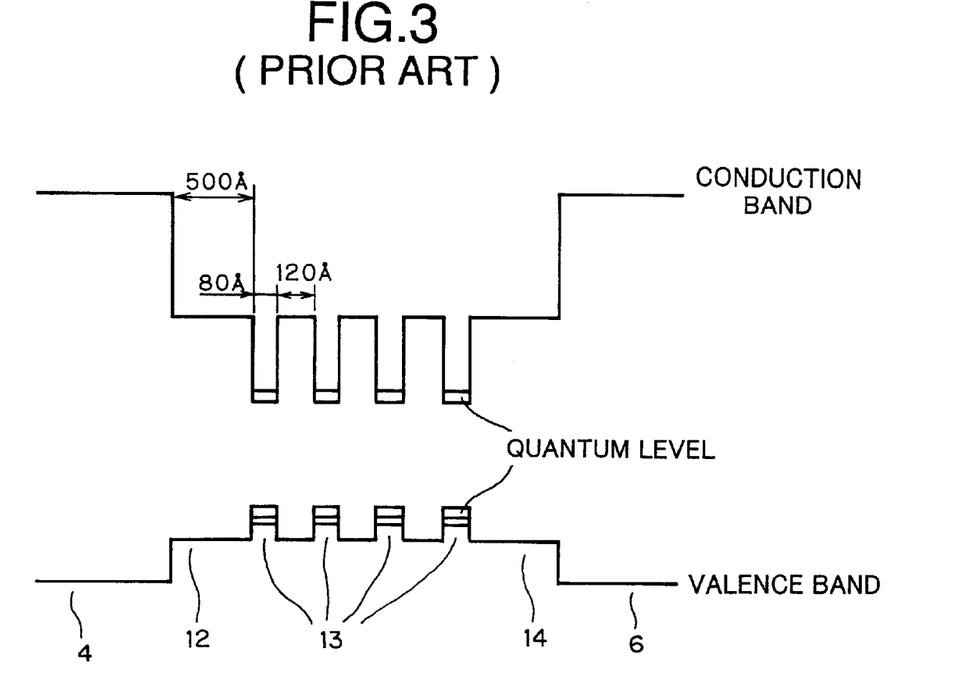
FIG. 3 is an energy band diagram of an active layer of the second conventional light-emitting diode.

The quantum well structure of the active layer is described below with reference to FIG. 3 depicting energy bands therein.

4 quantum-well layers 13 each having 80 Å in thickness is sandwiched between the lower barrier layer 12 and the upper barrier layer 14.

The LED having the quantum well type active layer may have a small overflow of injection carriers and attain a higher light output than that of the conventional LED of FIG. 1. However, this LED cannot attain high-speed response characteristic because of a large number of wells, decreasing the density of injected carriers and elongating the lifetime of carrier recombination. In other words, the multiple quantum-well structure of the LED is advantageous to attain a high light output but disadvantageous to improve the response characteristic. In contrast to the first conventional LED, the second conventional LED cannot possess a high-speed response characteristic.

As described above, the LED having a usual bulk type active layer may have high-speed response characteristic by reducing the thickness of the active layer and increasing the carrier concentration but cannot attain a sufficient initial radiant output light power and a stable light emission during the operation.

On the contrary, the LED having the multi-quantum-well structure may attain a sufficient initial light output and a stable light emission during energizing period but may not attain a high-speed response characteristic.

SUMMARY OF THE INVENTION

An object of the present invention is to provide a light-emitting diode that has an excellent high-speed response characteristic as well as a large output light power and a very small variation of light emission during its operation.

Another object of the present invention is to provide a light-emitting semiconductor element wherein a half width of a spectrum of light emitted from an active layer is not less than 25 nm and a rise time and a fall time of a rectangle pulse current are each of no more than 4 ns.

Another object of the present invention is to provide a light-emitting semiconductor element, wherein the active layer comprises a single quantum well layer and two barrier layers sandwiching the quantum well layer therebetween and said active layer is doped with p-type or n-type impurity.

Another object of the present invention is to provide a light-emitting semiconductor element, wherein the carrier concentration of the dopant impurity is within a range of $1\times10^{17}$ cm$^{-3}$ to $1\times10^{19}$ cm$^{-3}$.

Another object of the present invention is to provide a light-emitting semiconductor element, wherein the active layer is doped with the impurity by a method for diffusing the dopant thereto.

Another object of the present invention is to provide a light-emitting semiconductor element, wherein material of the p-type impurity is any one of Zn, Mg, Be and C and material of the n-type impurity is any one of Si, Se and Te.

Another object of the present invention is to provide a light-emitting semiconductor element, wherein a current diffusing layer or a cap layer is formed by regrowth.

Another object of the present invention is to provide a surface-emission type light-emitting semiconductor element, wherein a half width of light emitted from an active layer of $(Al_xGa_{1-x})_yIn_{1-y}P$ material is not less than 25 nm and a rise time and a fall time of a rectangle pulse current are each of no more than 4 ns.

Another object of the present invention is to provide a surface-emission type light-emitting semiconductor element, wherein a mixed crystal ratio 1-y of In in the quantum well layer of $(Al_xGa_{1-x})_yIn_{1-y}P$ is not less than 0.5 for applying a distortion by a compressive strain to the quantum well layer to produce a longer light wave therefrom.

Another object of the present invention is to provide a surface-emission type light-emitting semiconductor element, wherein a mixed crystal ratio x of Al in the barrier layers of $(Al_xGa_{1-x})_yIn_{1-y}P$ disposed on both sides of the quantum well layer of $(Al_xGa_{1-x})_yIn_{1-y}P$ is set to a value within a range of 0.4 to 1.0.

Another object of the present invention is to provide a surface-emission type light-emitting semiconductor element, wherein thickness of each of the barrier layers of $(Al_xGa_{1-x})_yIn_{1-y}P$ disposed on both sides of the quantum well layer of $(Al_xGa_{1-x})_yIn_{1-y}P$ is set to a value within a range of 50 Å to 300 Å.

A further object of the present invention is to provide a surface-emission type light-emitting semiconductor element, wherein a lattice-unmatched active layer is grown on a substrate tilted at an angle of not less than 5° and not more than 15° for a direction (011).

A Still further object of the present invention is to provide a surface-emission type light-emitting semiconductor element, wherein there is a single quantum-well active layer grown on a light-reflecting layer.

PREFERRED EMBODIMENT OF THE INVENTION

The present invention was made to solve the above--described problems involved in the conventional LEDs. Namely, all the problems have been solved by a light-emitting diode according to the present invention, which has a single quantum well layer sandwiched between upper and lower barrier layers and doped with impurities by a spreading technique to achieve a spectrum half width of no less than 20 nm.

The light-emitting diode is featured in that it is made of semiconductor material $(Al_xGa_{1-x})_yIn_{1-y}P$ on which a well structure layer of $Ga_{0.51}In_{0.49}P$ is formed as sandwiched between barrier layers made of $(Al_{0.5}Ga_{0.5})_{0.51}In_{0.49}P$ and is doped with impurities to achieve a carrier concentration of no less than $5\times10^{17}$ cm$^{-3}$.

As described before in regard to the prior art, a high-speed response characteristic of the light-emitting diode may be achieved by making narrower the active layer to increase the density of current therein and by increasing the concentration of carriers therein to make shorter the lifetime of recombination of carriers. However, the attempt to achieve the above for the LED of semiconductor $(Al_xGa_{1-x})_yIn_{1-y}P$ having a large output of light of 650 nm in wavelength, which may have a least optical loss in a plastic fiber optic cable, resulted in decreasing output light power and increasing variation of light quantity during the operation.

The light-emitting diode according to the present invention has an active layer with a single quantum well sandwiched between two barrier layers, all of which are doped to increase recombination of carriers at both barrier boundaries for improvement of the response characteristic of the semiconductor element.

Figure 4:
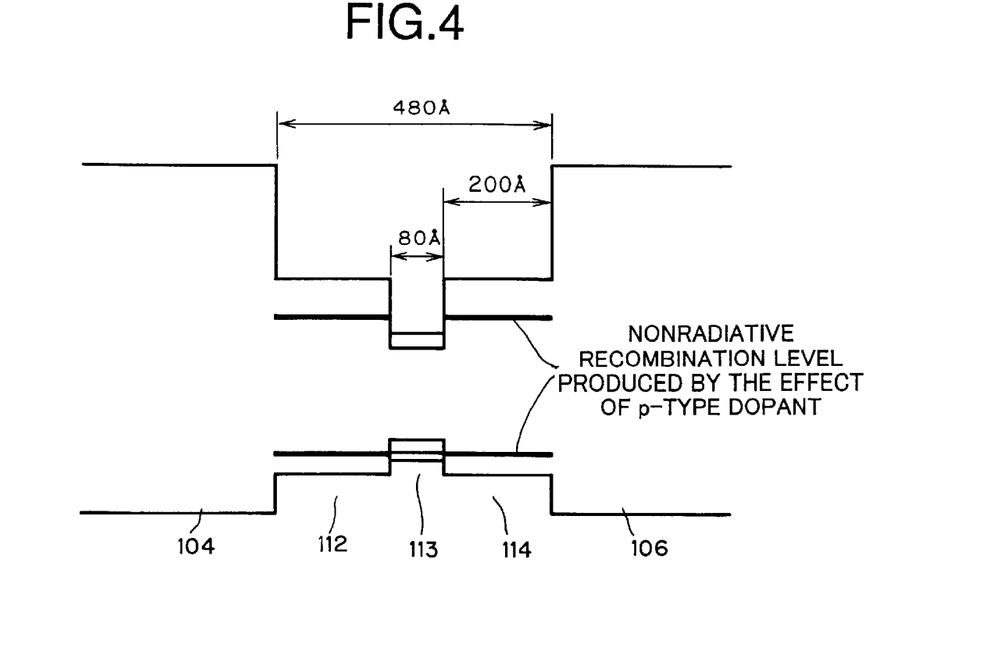
FIG. 4 is an energy band diagram of an active layer of a light-emitting semiconductor element according to the present invention.

FIG. 4 is an energy band diagram near an active layer.

In FIG. 4, there is shown a lineup view of energy bands observed in the structure obtained by forming a series of layers will epitaxial growth on a lower clad layer 104 of n-type $Al_{0.51}In_{0.49}P$, that is, a lower barrier layer 112 of p-type $(Al_{0.5}Ga_{0.5})_{0.51}In_{0.49}P$, a quantum well layer 113 of p-type $Ga_{0.51}In_{0.49}P$, an upper barrier layer 114 of p-type $(Al_{0.5}Ga_{0.5})_{0.51}In_{0.49}P$ and an upper clad layer 106 of p-type $Al_{0.51}In_{0.49}P$ are subsequently formed. In contrast to the conventional light-emitting diode, the light-emitting diode of the present invention has a single quantum-well layer 113, which, together with upper and lower barrier layers 112 and 114, is highly doped with p-type or n-type dopant impurities sufficient to form nonradiative recombination level in both the barrier layers 112, 114.

Figure 5:
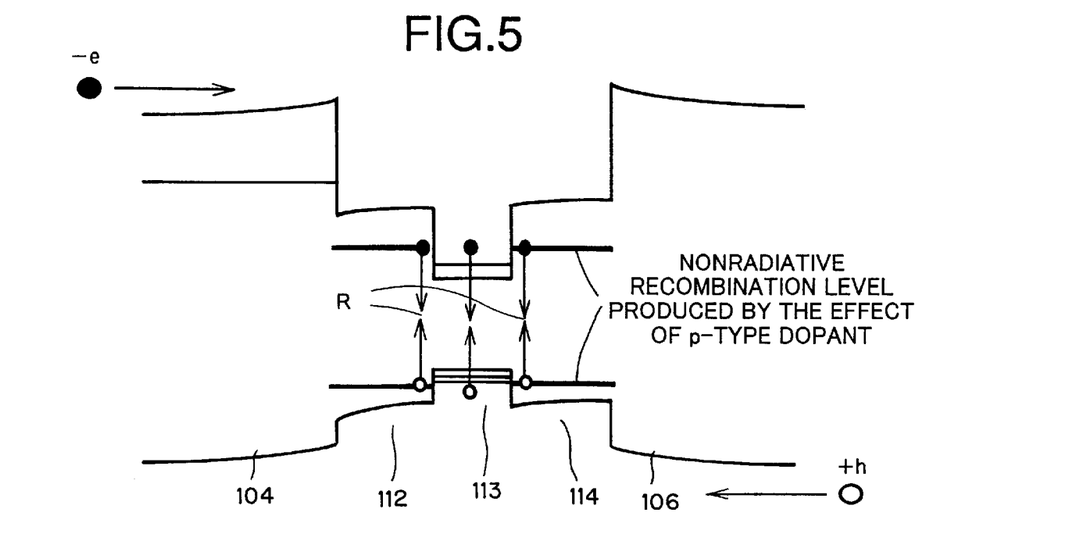
FIG. 5 is illustrative of motion of carriers in an active layer of a light-emitting semiconductor element according to the present invention.

The operation of the light-emitting diode according to the present invention is described below with reference to FIG. 5 showing on-state energy bands in the semiconductor.

In FIG. 5, electrons and holes injected through the n-type lower clad layer 104 and the p-type upper clad layer 106 recombine in the p-type quantum well layer 113. The large concentration of injected carriers in the single quantum-well layer 113 may increase the density of current therein and shorten the lifetime of radiative recombination of carriers. This may improve the response characteristic of the LED.

In this instance, as described later, the semiconductor $(Al_xGa_{1-x})_yIn_{1-y}P$ is highly doped with p-type dopant such as Zn, Mg and Be may have barrier layers with a nonradiative recombination level having a large capture section.

This stimulates the carriers injected into the quantum well layer 113 to recombine at boundaries between the quantum well layer 113 and the lower and upper barrier layers 112, 114 (This recombination is indicated as "R" in FIG. 5). In the other words, radiative recombination of carriers within the quantum well layer 113 and the nonradiative recombination of carriers at the boundary of the barrier layers 112, 114 coincidently occur, dramatically increasing the recombination velocity of carriers. This may achieve a great improvement of the response characteristic of the LED.

The p-type dopant highly added to the upper clad layer is diffused by a diffusion method (spreading method) into the barrier layers and the quantum-well layer to form the nonradiative recombination level in the single well structure.

In the $(Al_xGa_{1-x})_yIn_{1-y}P$ semiconductor, doping barrier layers and well layers is generally made by diffusing dopant from the upper layer since the dopant may easily diffuse with a higher Al composition "x" and the diffused dopant may easily form the nonradiative recombination level.

The Al composition is normally set to relatively low level to force the quantum well layer 113 to emit light of a wavelength of 650 nm. Therefore, p-type dopant diffuses but hardly forms nonradiative recombination level and activates, contributing to radiative recombination. This enables the active layer to emit light at higher efficiency.

Owing to a single quantum-well structure, a p-type dopant from the upper layer may diffuse through the quantum well layer 113 to the lower barrier layer 112. Therefore, the carriers injected into the quantum well layer 113 may recombine radiatively therein and nonradiatively in the upper and lower barrier layers 114 and 112 respectively. This may dramatically improve the response characteristic of the semiconductor element.

Thus, the light-emitting diode having an excellent high-speed response characteristic, high efficiency and high radiant output with no variation of output light can be produced by applying a single well structure to a light-emitting layer and highly doping the well layer and the barrier layers.

Referring to FIGS. 6 to 12, preferred embodiments 1, 2 and 3 will be described below.

First Embodiment

Figure 6:
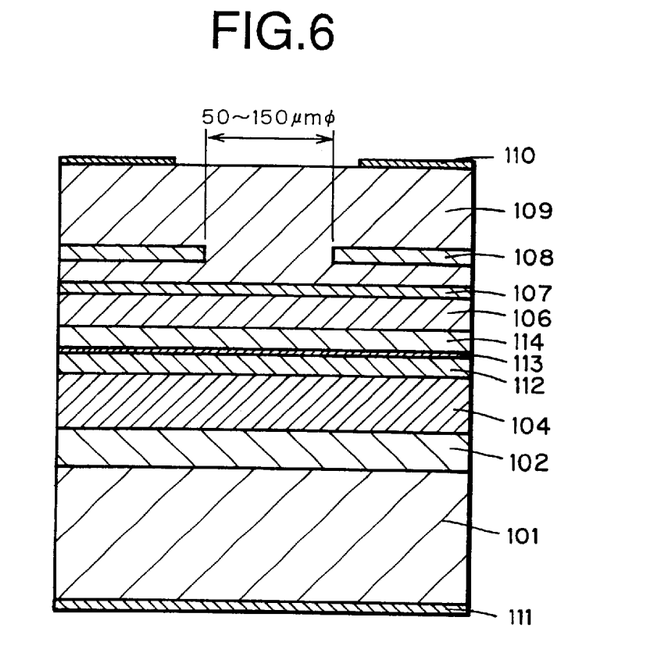
FIG. 6 is a sectional construction view of a light-emitting diode according to a first-embodiment of the present invention.

FIG. 6 is a sectional construction view of a light-emitting diode (LED) according to the first embodiment of the present invention.

As shown in FIG. 6, LED of the first embodiment has an n-type GaAs substrate 101 with layers subsequently deposited thereon, i.e., an n-type GaAs buffer layer 102 (e.g., 0.5 µm thick layer with carrier concentration of $5\times10^{17}$ cm$^{-3}$), a lower clad layer 104 of n-type $(Al_xGa_{1-x})_{0.51}In_{0.49}P$ ($0\leq x\leq 1$) (e.g., x=1.0, thickness 1.0 µm, carrier concentration $5\times10^{17}$ cm$^{-3}$), a lower barrier layer 112 of p-type $(Al_xGa_{1-x})_{0.51}In_{0.49}P$ ($0\leq x\leq 1$) (e.g., x=0.5, thickness 200 Å, carrier concentration $8\times10^{17}$ cm$^{-3}$), a quantum well layer 113 of p-type $Ga_{0.51}In_{0.49}P$ (e.g., thickness 80 Å, carrier concentration $8\times10^{17}$ cm$^{-3}$), an upper barrier layer 114 of p-type $(Al_xGa_{1-x})_{0.51}In_{0.41}P$ ($0\leq x\leq 1$) (e.g., x=0.5, thickness 200 Å, carrier concentration $8\times10^{17}$ cm$^{-3}$), an upper clad layer 106 of p-type $(Al_xGa_{1-x})_{0.51}In_{0.49}P$ ($0\leq x\leq 1$) (e.g., x=1.0, thickness 1.0 µm, carrier concentration $5\times10^{17}$ cm$^{-3}$), an intermediate layer 107 of p-type $(Al_xGa_{1-x})_yIn_{1-y}P$ (x=0.2, y=0.8, thickness 0.15 µm, carrier concentration $1\times10^{18}$ cm$^{-3}$), a current spreading layer 109 of p-type $(Al_xGa_{1-x})_yIn_{1-y}P$ (x=0.95, y=0.05, thickness 1.5 µm, carrier concentration $5\times10^{18}$ cm$^{-3}$) and an n-type GaP current blocking layer 108 (thickness 0.3 µm, carrier concentration $1\times10^{18}$ cm$^{-3}$).

Then, a current path of 50–150 µmφ in diameter is selectively etched by photolithography in the n-type GaP current blocking layer 108 and the current spreading layer 109 of p-type $(Al_xGa_{1-x})_yIn_{1-y}P$ (x=0.05, y=0.95, thickness 7 µm, carrier concentration $5\times10^{18}$ cm$^{-3}$) is grown again to complete the element structure.

Energy bands of the first embodiment are shown in FIG. 5. The quantum well layer 113, the lower barrier layer 112 and the upper barrier layer 114 are highly doped with p-type impurity and can thereby prevent variation of light output during the operation while maintaining brightness or output light power. The response characteristic of the element can be dramatically improved as compared with that of conventional bulk type or multi-well type device.

The light-emitting diode according to the first embodiment shown in FIG. 6 is prepared by using p-type Zn-dopant for a well of the 80 Å thick well layer sandwiched between the upper 200 Å thick barrier layer and the lower 200 Å thick barrier layer and tested. The test results shows that it can emit light of 650 nm in wavelength and obtain output power of 1.2 mW at an exciting current 30 mA. In this instance, its response to a rectangle wave current was determined by a rise time of 3.3 ns (from 10% to 90%) and a fall time of 3.5 ns and its frequency response characteristic to sine wave was determined as a cutoff frequency of 100 MHz.

Figure 7:
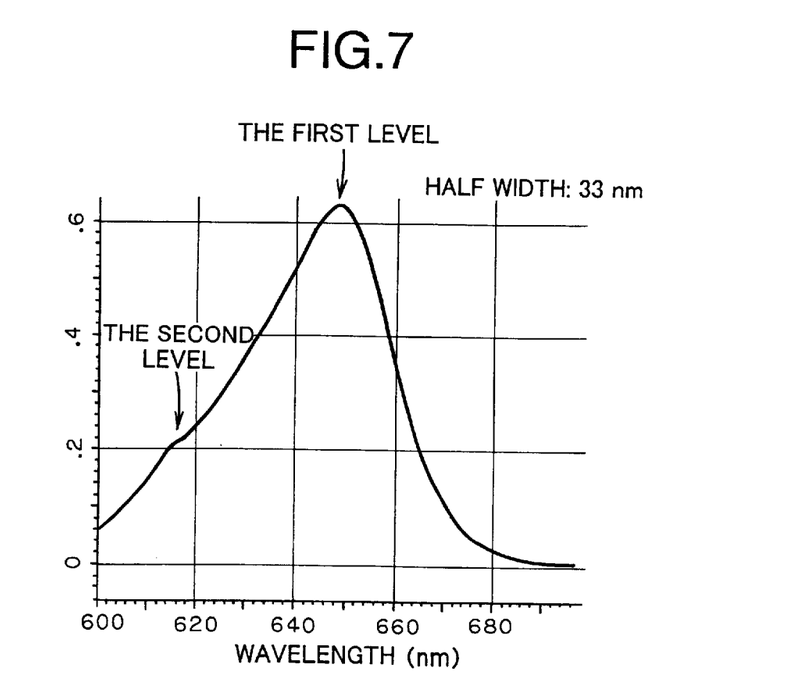
FIG. 7 is illustrative of an emission spectrum of a light-emitting diode according to the first embodiment of the present invention.

FIG. 7 illustrates an emission spectrum of the light-emitting diode according to the first embodiment of the present invention.

In the first embodiment, the density J of current injected into the active layer is high (J≧160 A/cm$^2$) and the carrier concentration is not less than 1×10$^{18}$ cm$^{-3}$. This higher-than-normal current density causes the LED to emit at the second quantum level (with wavelength of 620 nm) in the well layer. Therefore, the LED of the present invention is featured by its wide emission spectrum whose half-width is not less than 30 nm.

The LED according to the first embodiment is also featured in that the well layer and barrier layers are highly doped with p-type impurity in the process of crystal growth except for an intentionally undoped first DH portion of the well layer, and then the well layer and the barrier layers are doped with dopant diffused thereto to achieve the same characteristic during the regrowth of the current spreading layer.

Second Embodiment

A light-emitting diode according to the second embodiment of the present invention will be described below with reference to FIGS. 8 and 9.

Figure 8:
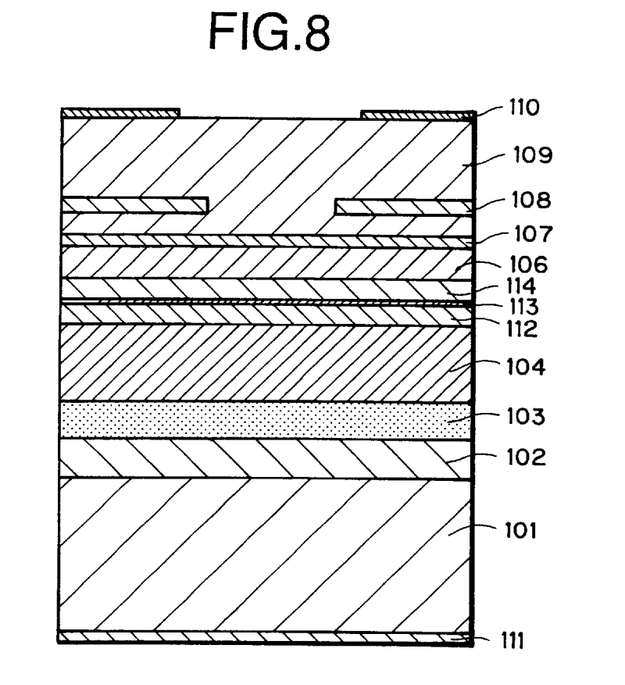
FIG. 8 is a sectional construction view of alight-emitting diode according to a second-embodiment of the present invention.

FIG. 8 is a sectional construction view of the light-emitting diode according to the second embodiment of the present invention, wherein components similar to those of the first embodiment are given the same numerals and described by using the same terms.

The LED of the second embodiment has, as shown in FIG. 8, an n-type GaAs substrate 101 with layers subsequently deposited thereon, i.e., an n-type GaAs buffer layer 102, a light-reflecting layer 103 (a distributed bragg reflector (DBR) layer with carrier concentration of 5×10$^{17}$ cm$^{-3}$) consisting of n-type Al$_x$Ga$_{1-x}$As (x=0.45) and n-type AlAs, a lower clad layer 104 of n-type (Al$_x$Ga$_{1-x}$)$_{0.51}$In$_{0.49}$P (0≦x≦1)(e.g., x=1.0, thickness 7.0 µm, carrier concentration 5×10$^{17}$ cm$^{-3}$), a lower barrier layer 112 of p-type (Al$_x$Ga$_{1-x}$)$_{0.51}$In$_{0.49}$P (0≦x≦1) (e.g., x=0.5, thickness 200 Å, carrier concentration 8×10$^{17}$ cm$^{-3}$), a quantum well layer 113 of p-type Ga$_{0.43}$In$_{0.57}$P (e.g., thickness 80 Å, carrier concentration 8×10$^{17}$ cm$^{-3}$), an upper barrier layer 114 of p-type (Al$_x$Ga$_{1-x}$)$_{0.51}$In$_{0.49}$P (0≦x≦1) (e.g., x=0.5, thickness 200 Å, carrier concentration 8×10$^{17}$ cm$^{-3}$), an upper clad layer 106 of p-type (Al$_x$Ga$_{1-x}$)$_{0.51}$In$_{0.49}$P (0≦x≦1) (e.g., x=1.0, thickness 1.0 µm, carrier concentration 5×10$^{17}$ cm$^{-3}$), an intermediate layer 107 of p-type (Al$_x$Ga$_{1-x}$)$_y$In$_{1-y}$P (x=0.2, y=0.8, thickness 0.15 µm, carrier concentration 1×10$^{18}$ cm$^{-3}$), a current spreading layer 109 of p-type (Al$_x$Ga$_{1-x}$)$_y$In$_{1-y}$P(x=0.05, y=0.95, thickness 1.5 µm, carrier concentration 5×10$^{18}$ cm$^{-3}$) and an n-type GaP current blocking layer 108 (thickness 0.3 µm, carrier concentration 1×10$^{18}$ cm$^{-3}$).

Then, a current path of 50 to 150 µmφ in diameter is selectively etched by photolithography in the n-type GaP current blocking layer and the current spreading layer 109 of p-type (Al$_x$Ga$_{1-x}$)$_y$ In$_{1-y}$P (x=0.05, y=0.95, thickness 7 µm, carrier concentration 5×10$^{18}$ cm$^{-3}$) is grown again to complete the element structure.

The light-emitting diode according to the second embodiment has the light-reflecting layer 103 disposed under the lower clad layer 104 to increase the light output. Therefore, light emitted downward from the quantum well layer 113 is reflected upward from the reflecting layer to interfere with light emitted upward from the same layer, producing ripples of the emission spectrum of the diode.

The LED according to the second embodiment has an n-type lower clad layer 104 of 7 µm in thickness (thicker than usual layer of 0.5 to 1.0 µm) between the light-emitting (quantum well) layer 113 and the light-reflecting layer 103 to reduce the light interference.

Figure 9:
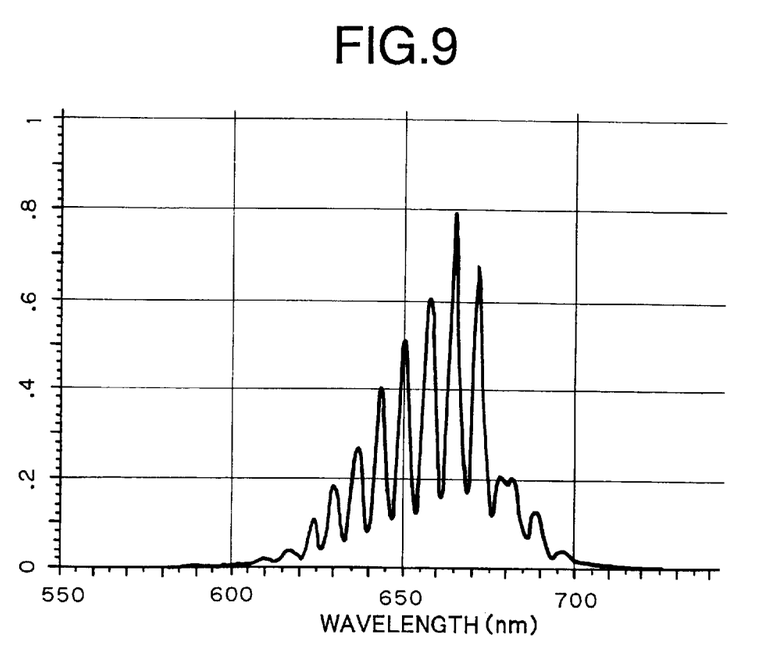
FIG. 9 is illustrative of an emission spectrum of a light-emitting diode according to the second embodiment of the present invention.

The emission spectrum of the LED according to the second embodiment is shown in FIG. 9.

The emission spectrum contains ripples reflecting an interference pattern produced by interference with light reflected from the DBR layer. However, an envelope of the emission spectrum has a wide half width of 35 nm that means the second embodiment emits light at the second energy level as the first embodiment does.

Figure 10:
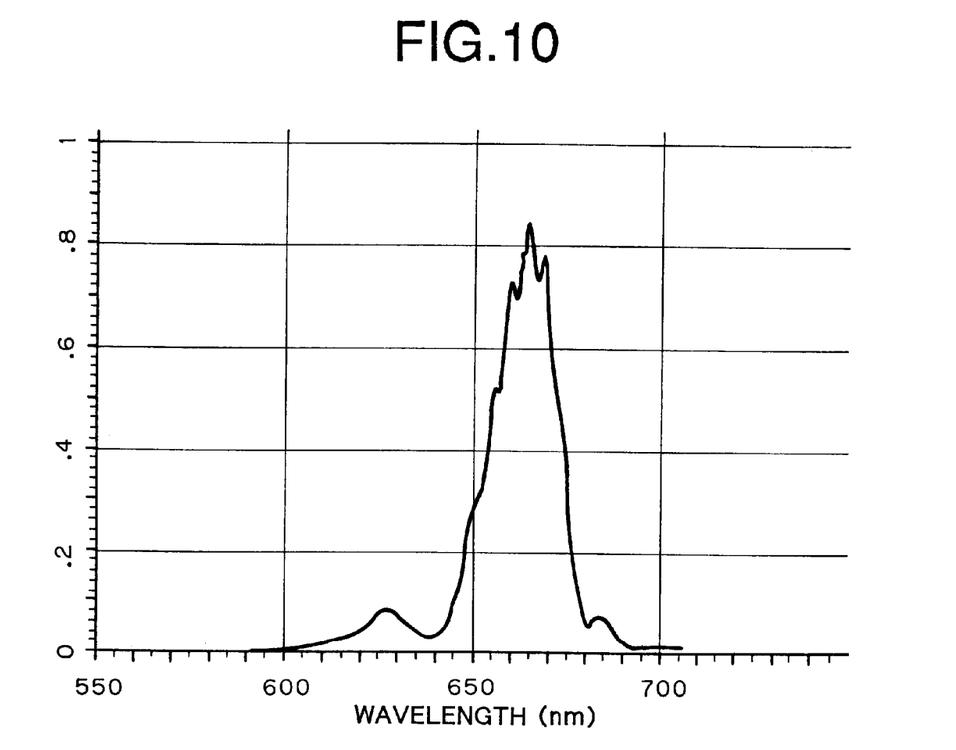
FIG. 10 is illustrative of another example of emission spectrum of the light-emitting diode according to the second embodiment of the present invention.

FIG. 10 shows the emission spectrum of the LED according to the second embodiment, which uses an n-type 0.3 µ-thick lower clad layer 104 that is thinner than the usual layer.

Since the ripple period is wide and troughs (valleys) of interference ripples falls between the first energy level and the second energy level of the emission spectrum, the half width of the emission spectrum seems narrower but, in practice, it is determined by the interference. Namely, trough positions of the interference ripples may be shifted with a change of thickness of the clad layer.

The LED according to the second embodiment shown in FIG. 8, which has a 80 Å thick well-layer sandwiched between two 200 Å thick barrier layers and uses Zn as p-type dopant, was prepared and tested. The test result proves that it is capable of emitting light of wavelength of 650 nm and obtaining output power of 2.4 mW at an exciting current of 30 mA. It is also proved that the presence of light-reflecting layer achieves a large light output power (2.4 mW), which is two times that of the first embodiment. The measured response characteristic of the LED indicates that a rise time from 10% to 90% of the rectangular wave current is 3.3 ns and a fall time is 3.5 nm. Namely, the response characteristic of the second embodiment corresponds to that of the first embodiment.

A cutoff frequency of 100 MHz was obtained as the frequency response to a sine wave.

Third Embodiment

Figure 11:
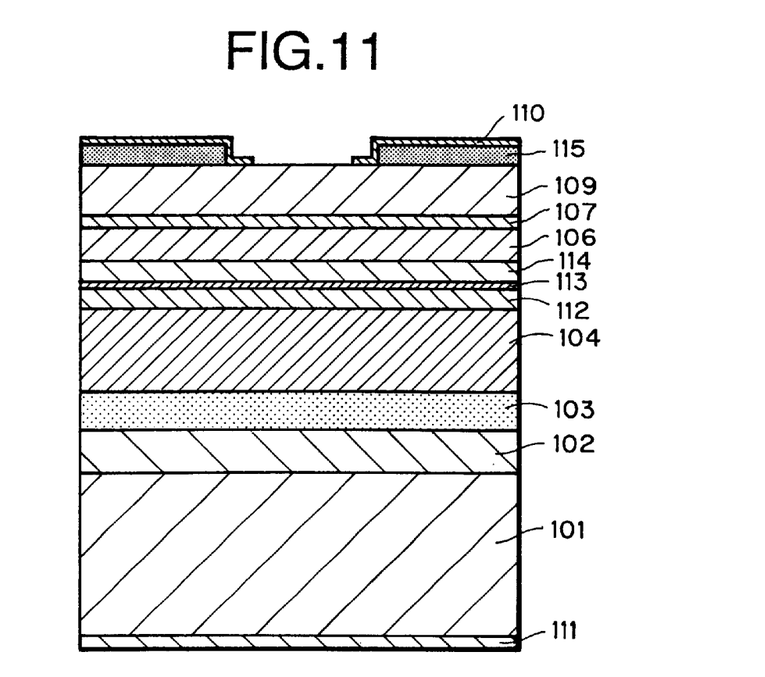
FIG. 11 is a sectional construction view of a light-emitting diode according to a third-embodiment of the present invention.
Figure 12:
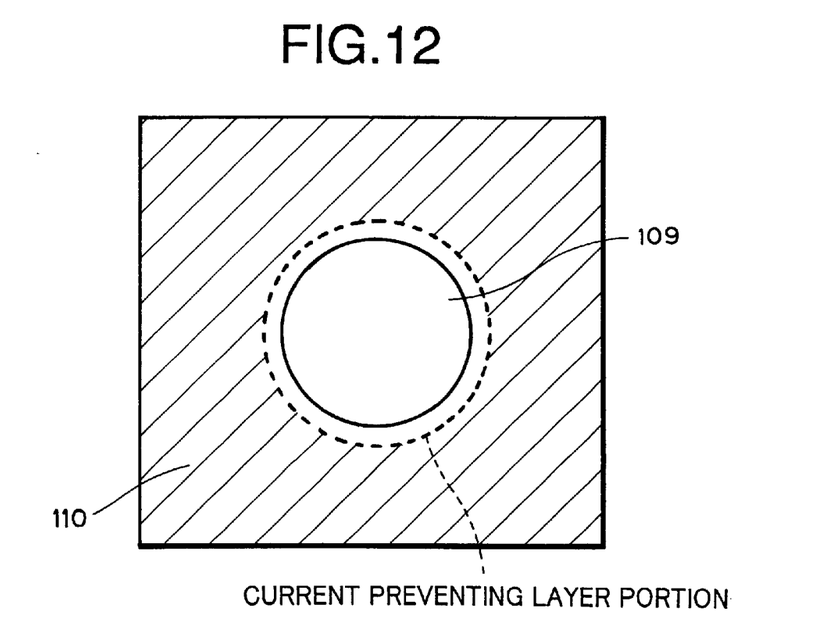
FIG. 12 is a plan view of a light-emitting diode according to the third embodiment of the present invention.

Referring to FIGS. 11 and 12, a light-emitting diode according to the third embodiment of the present invention is described below.

FIG. 11 is a sectional construction view of the light-emitting diode of the third embodiment. FIG. 12 is a plan view of the same device.

The light-emitting diode according to the third embodiment has, as shown in FIG. 11, an n-type GaAs substrate 101 with layers subsequently deposited thereon, i.e., an n-type GaAs buffer layer 102, a light-reflecting layer 103 (a distributed bragg reflector (DBR) layer with carrier concentration of 5×10$^{17}$ cm$^{-3}$) consisting of n-type (Al$_x$Ga$_{1-x}$) As (x=0.45) and n-type AlAs, a lower clad layer 104 of n-type (Al$_x$Ga$_{1-x}$)$_{0.51}$In$_{0.49}$P (0≦x≦1)(e.g., x=1.0, thickness 7.0 µm, carrier concentration 5×10$^{17}$ cm$^{-3}$), a lower barrier layer 112 of p-type (Al$_x$Ga$_{1-x}$)$_{0.51}$In$_{0.49}$P (0≦x≦1) (e.g., x=0.5, thickness 200 Å, carrier concentration 8×10$^{17}$ cm$^{-3}$), a quantum well layer 113 of p-type Ga$_{0.43}$In$_{0.57}$P (e.g., thickness 80 Å, carrier concentration 8×10$^{17}$ cm$^{-3}$), an upper barrier layer 114 of p-type (Al$_x$Ga$_{1-x}$)$_{0.51}$In$_{0.49}$P ($0 \leq x \leq 1$) (e.g., x=0.5, thickness 200 Å, carrier concentration $8 \times 10^{17}$ cm$^{-3}$), an upper clad layer 106 of p-type (Al$_x$Ga$_{1-x}$)$_{0.51}$In$_{0.49}$P ($0 \leq x \leq 1$) (e.g., x=1.0, thickness 1.0 μm, carrier concentration $5 \times 10^{17}$ cm$^{-3}$), an intermediate layer 107 of p-type (Al$_x$Ga$_{1-x}$)$_y$In$_{1-y}$P (x=0.2, y=0.8, thickness 0.15 μm, carrier concentration $1 \times 10^{18}$ cm$^{-3}$), a current spreading layer 109 of p-type (Al$_x$Ga$_{1-x}$)$_y$In$_{1-y}$P (x=0.05, y=0.95, thickness 1.5 μm, carrier concentration $5 \times 10^{18}$ cm$^{-3}$) and an n-type GaP current blocking layer 115 (thickness 1.0 μm, carrier concentration $5 \times 10^{18}$ cm$^{-3}$).

Then, a current path of 50 to 150 μmφ in diameter is selectively etched by photolithograpy in the n-type GaP current blocking layer to complete the element structure.

Since the light-emitting diode in the third embodiment, different from the first and second embodiments, contains a current-contracting layer formed by one process growth, a p-type dopant such as Zn and Mg can not easily diffuse into the quantum well layer 113 and the upper and lower barrier layers 112 and 114 in the epitaxial crystal structure. Therefore, this device after the growth of the current-contracting layer, the device is annealed in a nitrogen or hydrogen atmosphere at 800° C. for one hour so that dopant impurities (Zn or Mg) added to the upper clad layer 106, the intermediate layer 107 and the current spreading layer 109 may diffuse into the quantum well layer 113 and the upper and lower barrier layers 112 and 114.

Then, a film of Au—Be is deposited onto the p-type current spreading layer 109 and circularly patterned to form the light-omitting area and a p-type electrode 110 as shown in FIG. 12.

On the other hand, an n-type electrode 111 of Au—Ge film is deposited on the bottom surface of the GaAs substrate 101. The light-emitting diode of the third embodiment is thus completed.

The light-emitting diode according to the third embodiment shown in FIG. 11, which has an 80 Å thick well-layer sandwiched between two 200 Å thick barrier layers and doped with p-type Zn dopant, was prepared and tested. The test result proves that it is capable of emitting light of wavelength of 650 nm and obtaining output power of 2.4 mW at an exciting current of 30 mA. It is also proved that the presence of light-reflecting layer achieves a large light output power (2.4 mW), which is two times that of the first embodiment. The measured response characteristic of the LED indicates that a rise time from 10% to 90% of the rectangular wave current is 3.3 ns and a fall time is 3.5 ns, which corresponds to that of the first embodiment.

The frequency response characteristic tested at sine waves corresponds to the cutoff frequency of 100 MHz.

The p-type dopant Zn or Mg can be thus diffused into the quantum well layer and barrier layers by the annealing method to achieve an improved response characteristic of the device by increasing nonradiative recombination levels in the barrier layers.

The results of tests with a device of this embodiment, which was prepared without the annealing process for diffusing the p-type dopant, shows, as its response characteristic, a rise time of 6.4 ns from 10% to 90% and a fall time of 6.9 ns, and a cutoff frequency of 62 MHz as frequency response characteristic to sine waves. The comparison of the test results of the annealed diodes and the non-annealed diode proves that the annealing process could diffuse the p-type dopant into the quantum well layer and the barrier layers and form nonradiative recombination levels in the barrier layers, resulting in improvement of the response characteristic of the third embodiment. The light output of the non-annealed LED was 2.3 mW that is equivalent to that of the annealed LED.

Although the present invention has been described hereto with light-emitting diodes of (Al$_x$Ga$_{1-x}$)$_y$In$_{1-y}$P, it can be also applied to other light-emitting diodes of, e.g., AlGaAs, InGaAsP, InGaAs and GaInN. It is of course that dopant elements for the quantum well layer and the barrier layers are not limited to Zn, Mg and C and the same effect can be obtained by using n-type dopant elements such as Si, Se and Te.

As be apparent from the foregoing, the light-emitting diodes according to the present invention can achieve a large light output, a least variation of the light output during the operation and an excellent high-speed response characteristic owing to the effect of impurities added to active layer of a single well structure and both barrier layers in which the impurities nonradiatively combine with each other.

What is claimed is:

1. A light-emitting semiconductor element comprising a quantum well active layer and at least one barrier layer, wherein a half width of a spectrum of light emitted from the quantum well active layer is not less than 25 nm and a rise time and a fall time of a rectangle pulse current are each of no more than 4 ns.

2. A light-emitting semiconductor element as defined in claim 1, wherein the quantum well active layer comprises a single quantum well layer, and two barrier layers sandwich the quantum well active layer therebetween and said active and barrier layers are doped with p-type or n-type impurity.

3. A light-emitting semiconductor element as defined in claim 2, wherein the carrier concentration of the dopant impurity is within a range of $1 \times 10^{17}$ cm$^{-3}$ to $1 \times 10^{19}$ cm$^{-3}$.

4. A light-emitting semiconductor element as defined in claim 2, wherein the active layer is doped with the impurity by a method for diffusing the dopant thereto.

5. A light-emitting semiconductor element as defined in claim 2, wherein material of the p-type impurity is any one of Zn, Mg, Be and C and material of the n-type impurity is any one of Si, Se and Te.

6. A light-emitting semiconductor element as defined in claim 2, wherein a current diffusing layer or a cap layer is formed by regrowth.

7. The light-emitting semiconductor element of claim 1, wherein the quantum well active layer is provided between first and second barrier layers, and wherein the quantum well active layer and the barrier layers are sufficiently doped so that the half width of a spectrum of light emitted from the active layer is not less than 30 nm.

8. A surface-emission type light-emitting semiconductor element comprising a quantum well active layer and at least one baffler layer, wherein a half width of light emitted from the quantum well active layer comprising (Al$_x$Ga$_{1-x}$)$_y$In$_{1-y}$P is not less than 25 nm and a rise time and a fall time of a rectangle pulse current are each of no more than 4 ns.

9. A surface-emission type light-emitting semiconductor element as defined in claim 8, wherein a mixed crystal ratio 1−y of In in the quantum well layer, of (Al$_x$Ga$_{1-x}$)$_y$In$_{1-y}$P is not less than 0.5 for applying a distortion by a compressive strain to the quantum well layer to produce a longer light wave therefrom, and a half width of light emitted from the active layer is not less than 30 nm.

10. A surface-emission type light-emitting semiconductor element as defined in claim 9, wherein a mixed crystal ratio x of Al in the barrier layers of (Al$_x$Ga$_{1-x}$)$_y$In$_{1-y}$P disposed on both sides of the quantum well layer of (Al$_x$Ga$_{1-x}$)$_y$In$_{1-y}$P is set to a value within a range of 0.4 to 1.0.

11. A surface-emission type light-emitting semiconductor element as defined in claim 9, wherein thickness of each of the barrier layers of $(Al_xGa_{1-x})_yIn_{1-y}P$ disposed on both sides of the quantum well layer of $(Al_xGa_{1-x})_yIn_{1-y}P$ is set to a value within a range of 50 Å to 300 Å.

12. A surface-emission type light-emitting semiconductor element as defined in claim 8, wherein a lattice-unmatched active layer is grown on a substrate tilted at an angle of not less than 5° and not more than 15° relative to a (011) plane.

13. A surface-emission type light-emitting semiconductor element as defined in claim 8, wherein there is a single quantum-well active layer grown on a light-reflecting layer.

14. The light-emitting semiconductor element of claim 8, wherein the quantum well active layer is provided between first and second barrier layers, and wherein the quantum well active layer and the barrier layers are sufficiently doped so that the half width of a spectrum of light emitted from the active layer is not less than 30 nm.

15. A light-emitting semiconductor element comprising:

only a single quantum well active layer provided between first and second barrier layers, and wherein the barrier layers and the quantum well active layer are sufficiently doped so that a half width of a spectrum of light emitted from the active layer is not less than 30 nm.

16. The light-emitting semiconductor element of claim 15, wherein each of the single quantum well active layer, the first barrier layer and the second barrier layer is n-type doped.

17. The light-emitting semiconductor element of claim 15, wherein each of the single quantum well active layer, the first barrier layer and the second barrier layer is p-type doped.

18. The light-emitting semiconductor element of claim 15, wherein the single quantum well active layer is doped with an impurity concentration within a range of $1\times10^{17}$ cm$^{-3}$ to $1\times10^{19}$ cm$^{-3}$.

19. The light-emitting semiconductor element of claim 15, wherein the active layer comprises GaInP.

20. The light-emitting semiconductor element of claim 15, wherein each of the barrier layers comprises AlGaInP and each has a thickness within a range of 50 Å to 300 Å.

* * * * *